United States Patent
Chang et al.

(10) Patent No.: US 12,386,383 B2
(45) Date of Patent: Aug. 12, 2025

(54) MEMORY STRUCTURE WITH OPTIMIZED LATCH CLOCK DESIGN

(71) Applicants: TAIWAN SEMICONDUCTOR MANUFACTURING COMPANY, LTD., Hsinchu (TW); TSMC Nanjing Company Limited, Nanjing (CN)

(72) Inventors: Ming-Hung Chang, Tainan (TW); Luping Kong, Nanjing (CN); Jun Xie, Nanjing (CN); Ching-Wei Wu, Nantou County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 178 days.

(21) Appl. No.: 18/457,073

(22) Filed: Aug. 28, 2023

(65) Prior Publication Data

US 2025/0060777 A1    Feb. 20, 2025

(30) Foreign Application Priority Data

Aug. 17, 2023   (CN) .......................... 202311041214.9

(51) Int. Cl.
- G06F 1/08 (2006.01)
- G11C 16/24 (2006.01)
- G11C 16/28 (2006.01)

(52) U.S. Cl.
CPC ................ G06F 1/08 (2013.01); G11C 16/24 (2013.01); G11C 16/28 (2013.01)

(58) Field of Classification Search
CPC ..................................... G06F 1/08; G06F 1/10
See application file for complete search history.

(56) References Cited

U.S. PATENT DOCUMENTS

| | | | |
|---|---|---|---|
| 9,870,818 B1* | 1/2018 | Garg | G11C 8/10 |
| 2014/0153349 A1* | 6/2014 | Wu | G11C 7/1093 |
| | | | 365/233.11 |
| 2019/0147943 A1* | 5/2019 | Rana | G11C 8/18 |
| | | | 365/154 |

* cited by examiner

*Primary Examiner* — Raymond N Phan
(74) *Attorney, Agent, or Firm* — Birch, Stewart, Kolasch & Birch, LLP

(57) ABSTRACT

A memory device is provided and includes a memory array, first to second latch circuits and a gating circuit. Read and write operations are triggered by first and second edges of an internal clock signal respectively. The first latch circuit generates a first output signal in response to an input signal and a first latch clock signal, a first edge of the first latch clock signal generated based on the first edge of the internal clock signal. The second latch circuit generates a second output signal in response to the first output signal and a second latch clock signal, a first edge of the second latch clock signal being between first and second edges of the first latch clock signal. The gating circuit generates, in response to the second output signal and a gating clock generated, a third output signal to the memory array.

20 Claims, 10 Drawing Sheets

MEMORY STRUCTURE WITH OPTIMIZED LATCH CLOCK DESIGN

CROSS REFERENCE

The present application claims priority to China Application Serial Number 202311041214.9 filed on Aug. 17, 2023, which is herein incorporated by reference in its entirety.

BACKGROUND

Static random access memory (SRAM) is widely used in integrated circuits. SRAM cells store data in latches. An SRAM may be referred to as a dual/dual-port SRAM, indicating that the SRAM may be a dual-port SRAM or a dual-port SRAM.

In some designs, the SRAM may contain at least six transistors from which data is written or read by two pass gate transistors being conducted in response to a word line signal. Due to architectural constraints, the 6T SRAM uses a clock signal for both read and write operations. The rising edge of the clock signal is used for read operations and the falling edge of the clock signal is used for write operations, or vice versa.

However, the performance of the pseudo-dual/dual-port 6T SRAM is limited by the operations that take longer time in the same clock cycle. Specifically, this is because the read and write operations are tied together and the clock cycle time must be long enough to accommodate the one of the read and write operations that take longer to complete. In some application contexts, the write operation is the bottle neck of cycle time.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
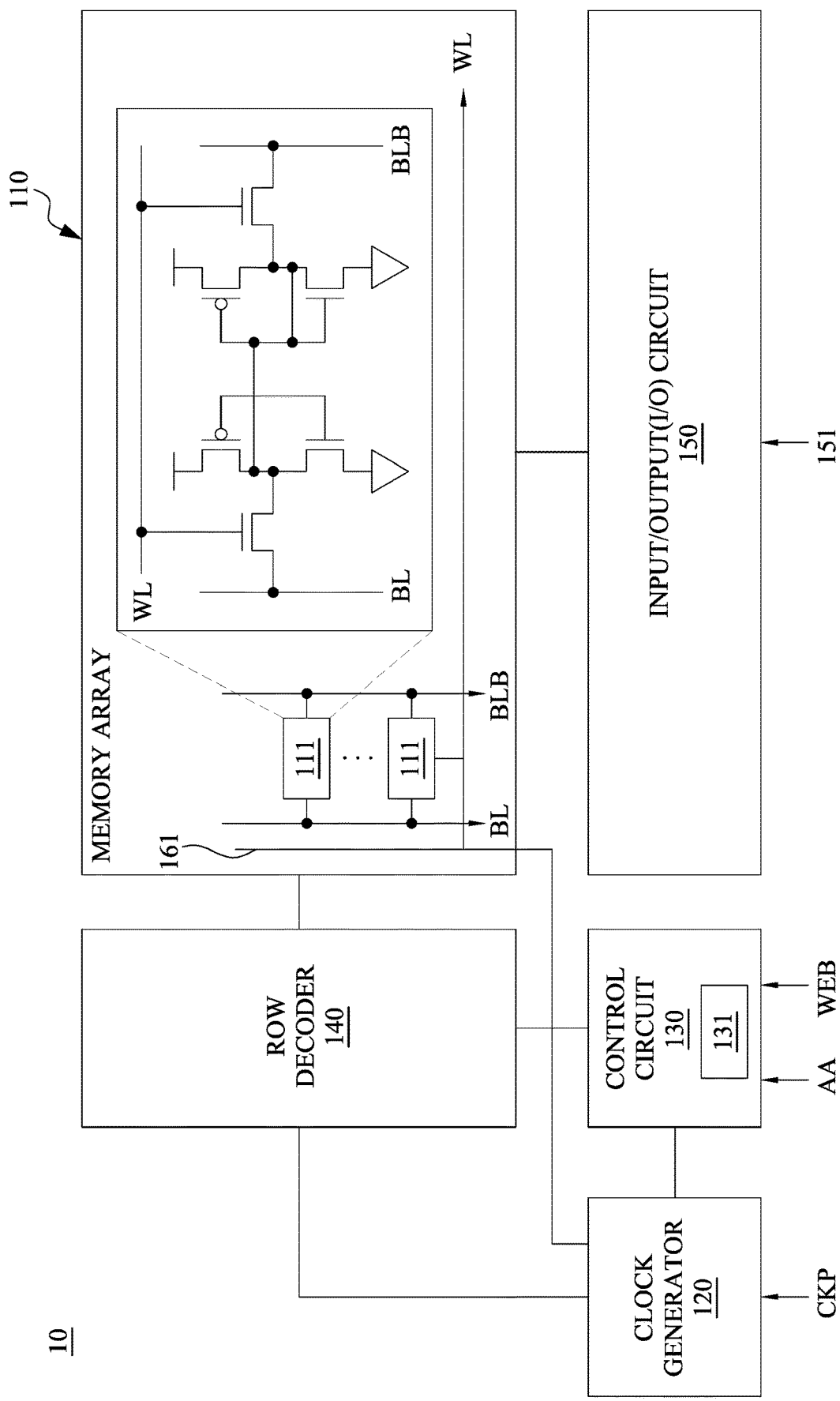
FIG. 1 illustrates an exemplary block diagram of a memory device including a memory array and circuits for performing read and write operations on the memory array, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

As used herein, the terms "comprising," "including," "having," "containing," "involving," and the like are to be understood to be open-ended, i.e., to mean including but not limited to.

As used herein, "around", "about", "approximately" or "substantially" shall generally refer to any approximate value of a given value or range, in which it is varied depending on various arts in which it pertains, and the scope of which should be accorded with the broadest interpretation understood by the person skilled in the art to which it pertains, so as to encompass all such modifications and similar structures. In some embodiments, it shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated, or meaning other approximate values.

Throughout the description, the symbol "/" represents "and" or "or," and whether the symbol "/" represents an "and" or an "or" is related to the context in which the symbol "/" is used.

A clock generation scheme for reading and writing memory cells in a memory array and the exemplary clock generation circuits are provided in accordance with various exemplary embodiments. The variations and the operation of the embodiments are discussed. Throughout the various views and illustrative embodiments, like reference numbers are used to designate like elements. Throughout the description, for example, in FIGS. 4, 7 and 9, the rising edges of some clock signals are used as examples for triggering actions such as the generation internal clock signal edges. In alternative embodiments, the falling edges may also be used to trigger actions. It is appreciated that the concepts "row" and "column" may be interchangeable, and the concepts "row address" and "column address" may be interchangeable, an address may thus be referred to as a "row/column" address, indicating it may be a row address or a column address.

Figure 4:
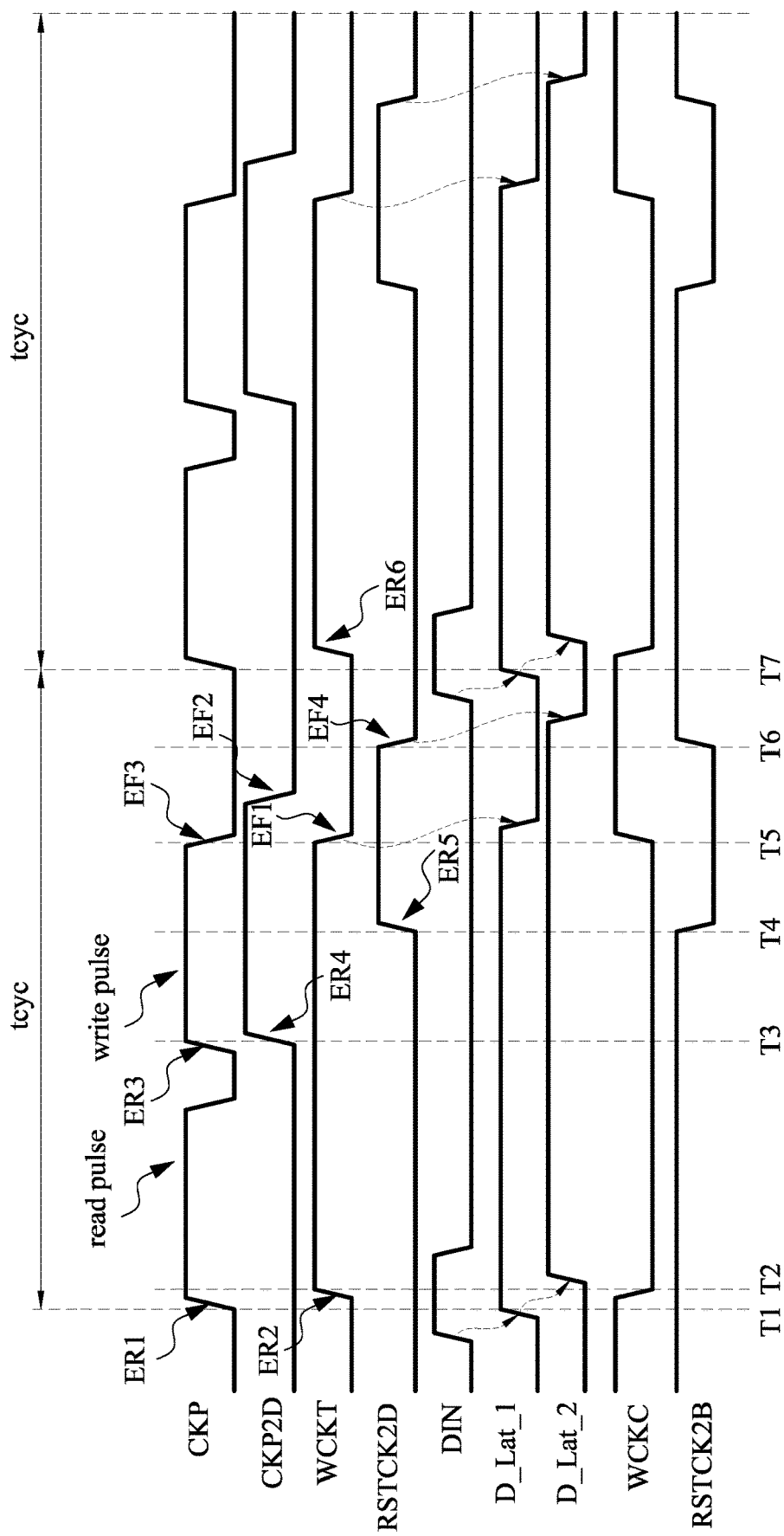
FIG. 4 illustrates waveforms of signals in the memory device in FIG. 1 operating corresponding to the method in FIG. 5, in accordance with some embodiments of the present disclosure.
Figure 9:
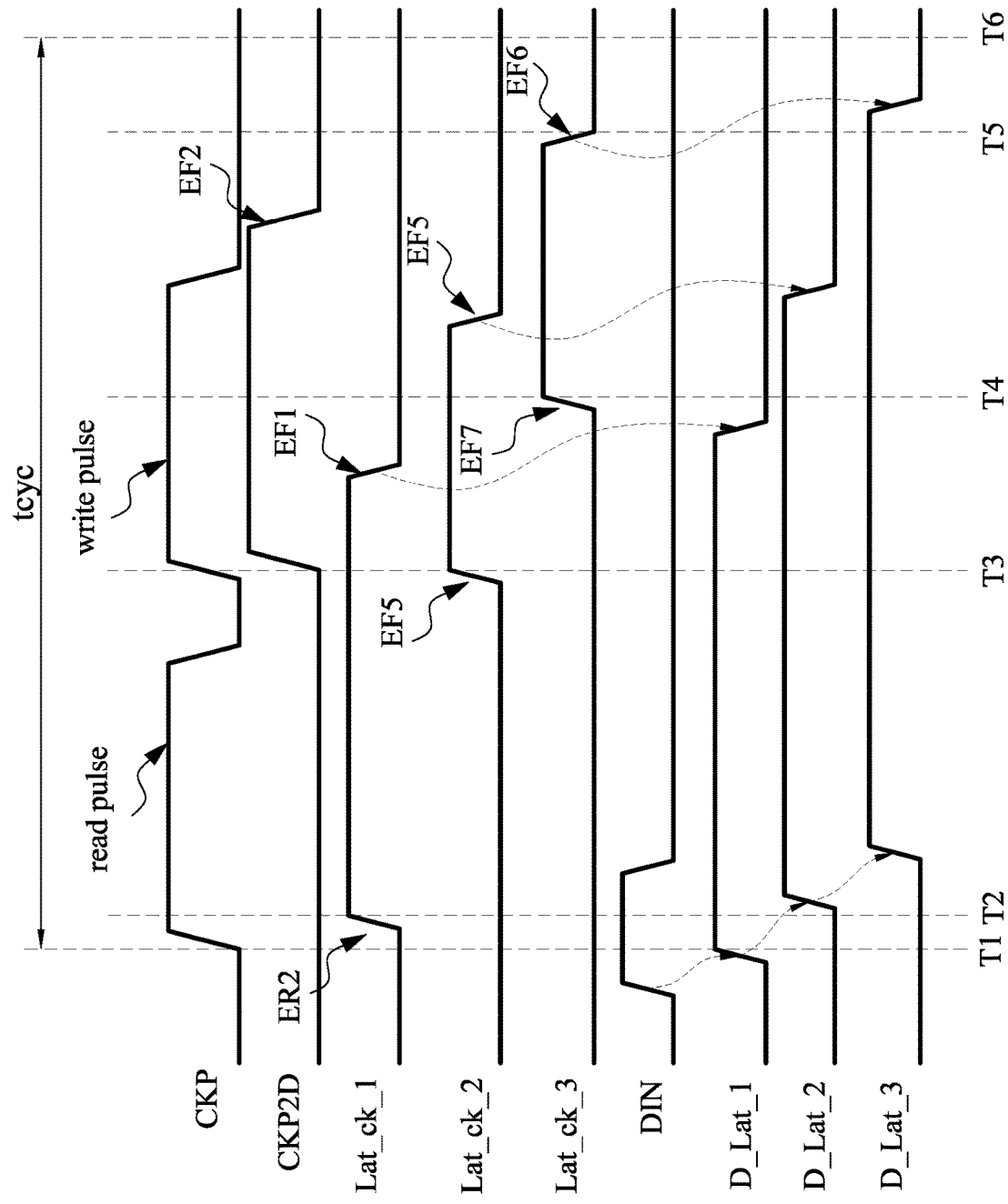
FIG. 9 illustrates waveforms of signals in the memory device in FIG. 1, in accordance with some embodiments of the present disclosure.

Reference is now made to FIG. 1. FIG. 1 illustrates an exemplary block diagram of a memory device 10 including a memory array 110 and circuits, in accordance with some embodiments of the present disclosure. For illustration, the memory device 10 further includes a clock generator 120, a control circuit 130, a row decoder 140, and an input/output circuit 150 for performing read and write operations on the memory array 110. The memory array 110 includes multiple memory cells 111 that are arranged in rows and columns of the memory array 110 and coupled to bit lines BL and BLB to receive or to output data for or from the memory cells 111 in response to word lines WL. Only one column of memory cell 111 are depicted for illustrative purposes. In some embodiments, the memory cells 111 includes six-transistor (6T) Static Random Access Memory (SRAM) cells, in which an exemplary circuit diagram of a 6T SRAM cell is shown, and operates as pseudo dual port (PDP) memory cell. Although the external operation of pseudo dual port memory resembles the operation of true dual port memory, pseudo dual port memory incorporates a single port core cell. Pseudo dual port memory should perform multiple read and/or write operations within same clock cycle of internal clock signal CKP (FIGS. 4 and 9). The timing is achieved through the use of one internal clock signal CKP.

The clock generator 120, the control circuit 130, the row decoder 140, and the input/output circuit 150 that operate as the supporting circuits for performing read and write operations on memory array 110. For example, in some embodiments, the clock generator 120 is configured to receive the internal clock signal CKP, including two portions each used for the read and write operations of the memory cells 111, to generate corresponding clock signals.

The control circuit 130 is configured to control peripheral circuit to perform the read and write operations to the memory array 110. For example, in a write operation, a write address latch 131 and a pre-decoder (not shown) that are in the control circuit 130 are configured to receive and latch write address AA (a row address), and pre-decode write address AA. The pre-decoded addresses are provided to the row decoder 140, which selects one of the word lines WL and drives word lines WL. The selected word line WL is the word line of the memory cell 111 on which the write operation is to be performed. The control circuit 130 is further configured to receive a write enable signal WEB to trigger the write operation.

The input/output circuit 150 is configured to decode the column of the selected memory cell 111 for performing the write operation and the read operation. For example, in some embodiments, the input/output circuit 150 includes a column decoder, a read column decoder and a sense amplifier configured to read from, and amplifier signals for, bit lines BL and BLB of the memory array 110. In some embodiments, the input/output circuit 150 is further configured to write the input data 151 to the bit lines BL and BLB of the memory array 110.

Figure 2:
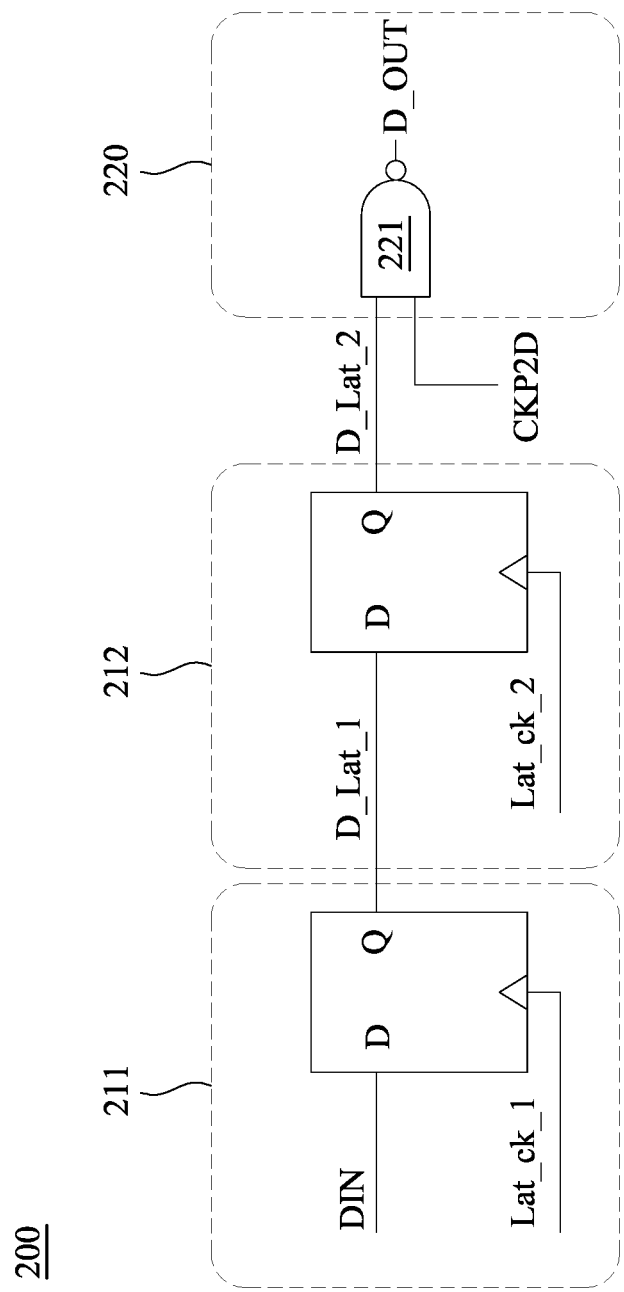
FIG. 2 is a schematic diagram of a write port input latch circuit, in accordance with some embodiments of the present disclosure.

Reference is now made to FIG. 2. FIG. 2 is a schematic diagram of a write port input latch circuit 200, in accordance with some embodiments of the present disclosure. The write port input latch circuit 200 is configured to receive an input signal DIN and to output a gating output signal D_OUT associated with the input signal DIN in response to latch clock signals Lat_ck_1-Lat_ck_2 and a gating clock signal CKP2D. In some embodiments, the write port input latch circuit 200 is coupled to the input terminal of the memory device 10 to receive operational signals, for example, a signal indicating the write address AA, the write enable signal WEB, or the input data 151. In some embodiments, the write port input latch circuit 200 is implemented as the write address latch 131 and receives a signal, indicating the write address AA, as the input signal DIN. In another embodiment, the write port input latch circuit 200 is included in the control circuit 130 to latch data associated with the write enable signal WEB and further generates corresponding signal as the gating output signal D_OUT to trigger the write operation. In yet another embodiment, the write port input latch circuit 200 is included in the input/output circuit 150 to receive the input data 151 as the input signal DIN and to generate corresponding signal as the gating output signal D_OUT to the bit lines BL and BLB of the memory array 110.

For illustration, the write port input latch circuit 200 includes latch circuits 211-212 that are coupled in series to a gating circuit 220. In some embodiments, the gating circuit 220 includes a NAND gate 221. In operation, each of the latch circuits 211-212 is configured to latch, in response to one of the latch clock signals Lat_ck_1-Lat_ck_2, data associated with the input signal DIN. Specifically, as shown in the embodiments of FIG. 2, the latch circuit 211 is configured to generate an output signal D_Lat_1 at a terminal Q in response to the input signal DIN received at a terminal D and the latch clock signal Lat_ck_1. The latch circuit 212 is configured to generate an output signal D_Lat_2 at a terminal Q in response to the output signal D_Lat_1 received at a terminal D and the latch clock signal Lat_ck_2. The gating circuit 220 is configured to generate the gating output signal D_OUT to the memory array 110 for the write operation in response to the output signal D_Lat_2 and the gating clock signal CKP2D.

The configurations of FIG. 2 are given for illustrative purposes. Various implements are within the contemplated scope of the present disclosure. For example, in some embodiments, the write port input latch circuit 200 is included in the input/output circuit 150 to latch data associated with a write enable signal BWEB, standing for Bit-Write-Enabled-Bar function which performs logical inversion of enabling a bit write signal, and further generates corresponding signal as the gating output signal D_OUT for the write operation.

Figure 3:
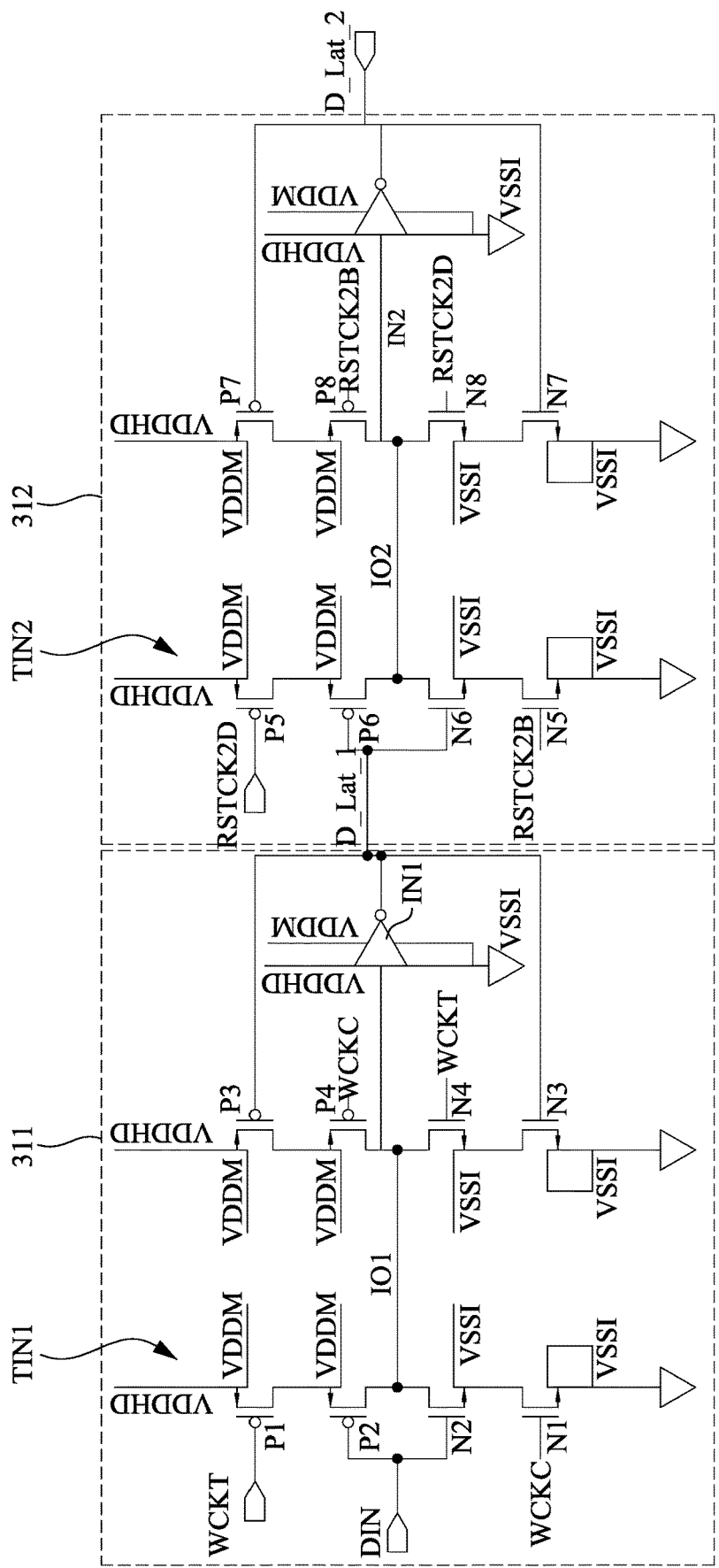
FIG. 3 is a detailed schematic diagram of latch circuits corresponding to the write port input latch circuit of FIG. 2, in accordance with some embodiments of the present disclosure.

Reference is now made to FIG. 3. FIG. 3 is a detailed schematic diagram of latch circuits 311-312 corresponding to the write port input latch circuit 200 of FIG. 2, in accordance with some embodiments of the present disclosure. In some embodiments, the latch circuit 311 is configured with respect to, for example, the latch circuit 211 of FIG. 2, and the latch circuit 312 is configured with respect to, for example, the latch circuit 212 of FIG. 2.

Specifically, the latch circuit 311 includes a tristate inverter TIN1 consisting of transistors P1-P2 and N1-N2, an inverter IN1 and transistors P3-P4 and N3-N4. The transistors P1-P2 and N1-N2 are coupled in series between voltage terminals proving voltages VDDHD and VSSI. Gates of the transistors P1 and N1 receive latch clock signals WCKT and WCKC respectively, in which the latch clock signal WCKT is configured with respect to, for example, the latch clock signal Lat_ck_1 of FIG. 2 and the latch clock signal WCKC is inverted from the latch clock signal WCKT. Gates of the transistors P2 and N2 receives the input signal DIN. The inverter IN1 is configured to generate the output signal D_Lat_1 based on an inner output signal IO1 from the tristate inverter TIN1. The transistors P3-P4 and N3-N4 are coupled in series between the voltage terminals proving voltages VDDHD and VSSI. Gates of the transistors P3 and N3 are coupled to the output of the inverter IN1. Gates of the transistors P4 and N4 receive the latch clock signals WCKC and WCKT respectively. Sources of the transistors P4 and N4 are coupled to the transistors P3 and N3 respectively. Drains of the transistors P4 and N4 are coupled to the input of the inverter IN1. The output of the inverter IN1 transmits the output signal D_Lat_1 to the latch circuit 312. The input signal DIN and the output signal D_Lat_1 have the same logic state that is different from that of the inner output signal IO1.

Similarly, the latch circuit 312 includes a tristate inverter TIN2 consisting of transistors P5-P6 and N5-N6, an inverter IN2 and transistors P7-P8 and N7-N8. The transistors P5-P6 and N5-N6 are coupled in series between voltage terminals proving voltages VDDHD and VSSI. Gates of the transistors P5 and N5 receive latch clock signals RSTCK2D and RSTCK2B respectively, in which the latch clock signal RSTCK2D is configured with respect to, for example, the latch clock signal Lat_ck_2 of FIG. 2 and the latch clock signal RSTCK2D is inverted from the latch clock signal RSTCK2B. Gates of the transistors P6 and N6 receives the output signal D_Lat_1. The inverter IN2 is configured to generate the output signal D_Lat_2 based on an inner output signal IO2 from the tristate inverter TIN2. The transistors P7-P8 and N7-N8 are coupled in series between the voltage terminals proving voltages VDDHD and VSSI. Gates of the transistors P7 and N7 are coupled to the output of the inverter IN2. Gates of the transistors P8 and N8 receive the latch clock signals RSTCK2B and RSTCK2D respectively. Sources of the transistors P8 and N8 are coupled to the transistors P7 and N7 respectively. Drains of the transistors P8 and N8 are coupled to the input of the inverter IN2. The output of the inverter IN2 transmits the output signal D_Lat_2 to the gating circuit 220 of FIG. 2. The input signal DIN, the output signal D_Lat_2 and the output signal D_Lat_1 have the same logic state that is different from that of the inner output signal IO2. Alternatively stated, the data of the input signal DIN is outputted through the latch circuits 311-312.

In some embodiments, as shown in FIG. 3, bases of the transistors P1-P8 receive a voltage VDDM. Bases of the trnsistors N1-N8 receive the voltage VSSI.

In various embodiments, the inverters IN1 and IN2 are configured to operate by the voltages VDDHD, VDDM and VSSI.

The configurations of FIG. 3 are given for illustrative purposes. Various implements are within the contemplated scope of the present disclosure. For example, in some embodiments, other latch circuit are applicable to implement the present application.

Figure 5:
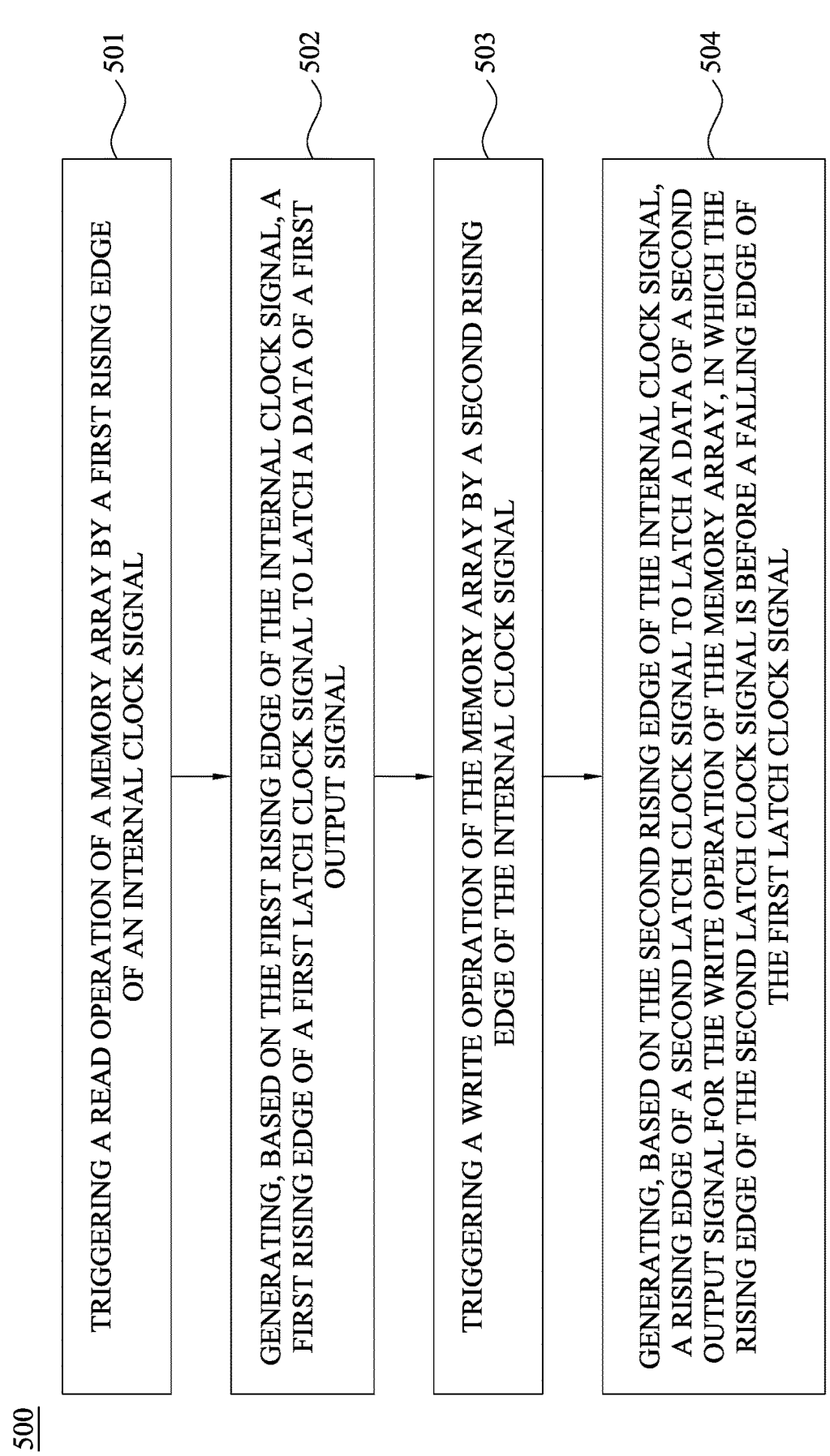
FIG. 5 is a flowchart of a method for operating the memory device in FIG. 1, in accordance with some embodiments of the present disclosure.

Reference is now made to FIGS. 4-5 and with the configurations of FIGS. 1-3. FIG. 4 illustrates waveforms of signals in the memory device 10 in FIG. 1 operating corresponding to a method 500 in FIG. 5, in accordance with some embodiments of the present disclosure. FIG. 5 is a flowchart of the method 500 for operating the memory device 10 in FIG. 1, in accordance with some embodiments of the present disclosure. It is understood that additional operations/stages can be provided before, during, and after the processes shown by FIG. 5, and some of the operations/stages described below can be replaced or eliminated, for additional embodiments of the method 600. The method 500 includes operations 501-504 and will be discussed in the following paragraphs with reference to FIGS. 1-5.

For illustration, as shown in FIG. 4, the latch clock signal WCKT and the latch clock signal RSTCK2D partially and successively overlap in a clock cycle tcyc, of the internal clock signal CKP, from time T1 to time T7. In some embodiments, in the clock cycle tcyc the read operation of the memory array 110 is triggered by a read pulse of the internal clock signal CKP and the write operation thereof is triggered by a write pulse of the internal clock signal CKP. Alternatively stated, the read and write operations of the memory array 110 are performed within a same clock cycle of the internal clock signal CKP.

Specifically, in operation 501 of FIG. 5, the read operation of the memory array 110 is triggered by a rising edge ER1 of the read pulse of the internal clock signal CKP at time T1, as shown in FIG. 4.

In operation 502, as shown in FIG. 4, the clock generator 120 generates, based on the rising edge ER1 of the internal clock signal CKP, a rising edge ER2 of the latch clock signal WCKT to latch a data of the output signal D_Lat_1. Specifically, at time T2, the latch circuit 311 operates in a latch mode to latch the data of the output signal D_Lat_1 having a high logic state in response to the latch clock signals WCKT and WCKC. The latch circuit 312 operates in a transparent mode to read the data the output signal D_Lat_1. Accordingly, after time T2, the latch circuit 312 generates the output signal D_Lat_2 having the high logic state in response to the output signal D_Lat_1.

In operation 503, as illustratively shown in FIG. 4, the write operation of the memory array 110 is triggered by a rising edge ER3 of the write pulse of the internal clock signal CKP at time T3. In some embodiments, the clock generator 120 further generates a rising edge ER4 of the gating clock signal CKP2D in response to the rising edge ER3. Accordingly, the gating circuit 220 generates the gating output signal D_OUT having the high logic state based on the output signal D_Lat_2. Alternatively stated, the data of the input signal DIN is "clocked out" from the write port input latch circuit 200 to the memory array 110 for the write operation.

In operation 504, the clock generator 120 generates, based on the rising edge ER3 of the internal clock signal CKP, a rising edge ER5 of the latch clock signal RSTCK2D to latch a data of the output signal D_Lat_2. Specifically, at time T4, both of the latch circuits 311-312 operate in the latch mode to latch the data of the output signals D_Lat_1 and D_Lat_2 respectively for the write operation of the memory array 110.

In some embodiments, a time difference between the rising edge ER2 of the latch clock signal WCKT and the rising edge ER5 of the latch clock signal RSTCK2D is greater than a delay time between the input terminal, receiving the output signal D_Lat_1, and the output terminal, outputting the output signal D_Lat_2, of the latch circuit 312. Alternatively stated, the time difference between the rising edge ER2 and the ER5 guarantees that the logic state of the output signals D_Lat_1-D_Lat_2 are the same before the latch circuit 312 switches to the latch mode to ensure that the data of the output signal D_Lat_2 is accurate. In some embodiments, the delay time between the input and output terminals of the latch circuit 312 is generated by the tristate inverter TIN2 and the inverter IN2. As the rising edges of the pulses in the latch clock signal WCKT and the latch clock signal RSTCK2D are associated with the time delay generated by the tristate inverter and the inverter in the latch circuit 312, the pulse width of the latch clock signals are associated with the time delay generated by the tristate inverter and the inverter in the latch circuit.

In some embodiments, at time T5, the clock generator 120 generates a falling edge EF1 of the latch clock signal WCKT. As shown in FIG. 4, the falling edge EF1 of the latch clock signal WCKT is after the rising edge ER5 of the latch clock signal RSTCK2D. Alternatively stated, the rising edge ER5 of the latch clock signal RSTCK2D is between the rising edge ER2 of the latch clock signal WCKT and the falling edge EF1 of the latch clock signal WCKT. In response to the falling edge EF1 of the latch clock signal WCKT, the latch circuit 311 switches to operate in the transparent mode to read data of the input signal DIN while the latch circuit 312 still operates in the latch mode to latch the data of the output signal D_Lat_2. Accordingly, the logic state of the output signal D_Lat_1 changes, for example, from the high logic state to the low logic state associated with the input signal DIN, and the logic state of the output signal D_Lat_2 keeps at the high logic state, as shown in the embodiments of FIG. 4.

In some embodiments, the clock generator 120 further generates a falling edge EF2 of the gating clock signal CKP2D based on a falling edge EF3 of the write pulse in the internal clock signal CKP in response to the termination of the write operation on the memory array 110. As illustratively shown in FIG. 4, the falling edge EF2 of the gating clock signal CKP2D is after the falling edge EF1 of the latch clock signal WCKT and the falling edge EF3 of the internal clock signal CKP.

Moreover, at time T6, the clock generator 120 generates a falling edge EF4 of the latch clock signal RSTCK2D based on the falling edge EF3 of the internal clock signal CKP. In response to the falling edge EF4 of the latch clock signal RSTCK2D, the latch circuit 312 changes from the latch mode to the transparent mode while the latch circuit 311 operates in the transparent mode. Accordingly, the logic state of the output signal D_Lat_2 changes, for example, from the high logic state to the low logic state.

In some embodiments, as shown in the embodiments of FIG. 4, the falling edge EF4 of the latch clock signal RSTCK2D is after the falling edge EF2 of the gating clock signal CKP2D. The falling edge EF4 of the latch clock signal RSTCK2D is further before a rising edge ER6 of the latch clock signal WCKT in the next cycle.

Figure 6:
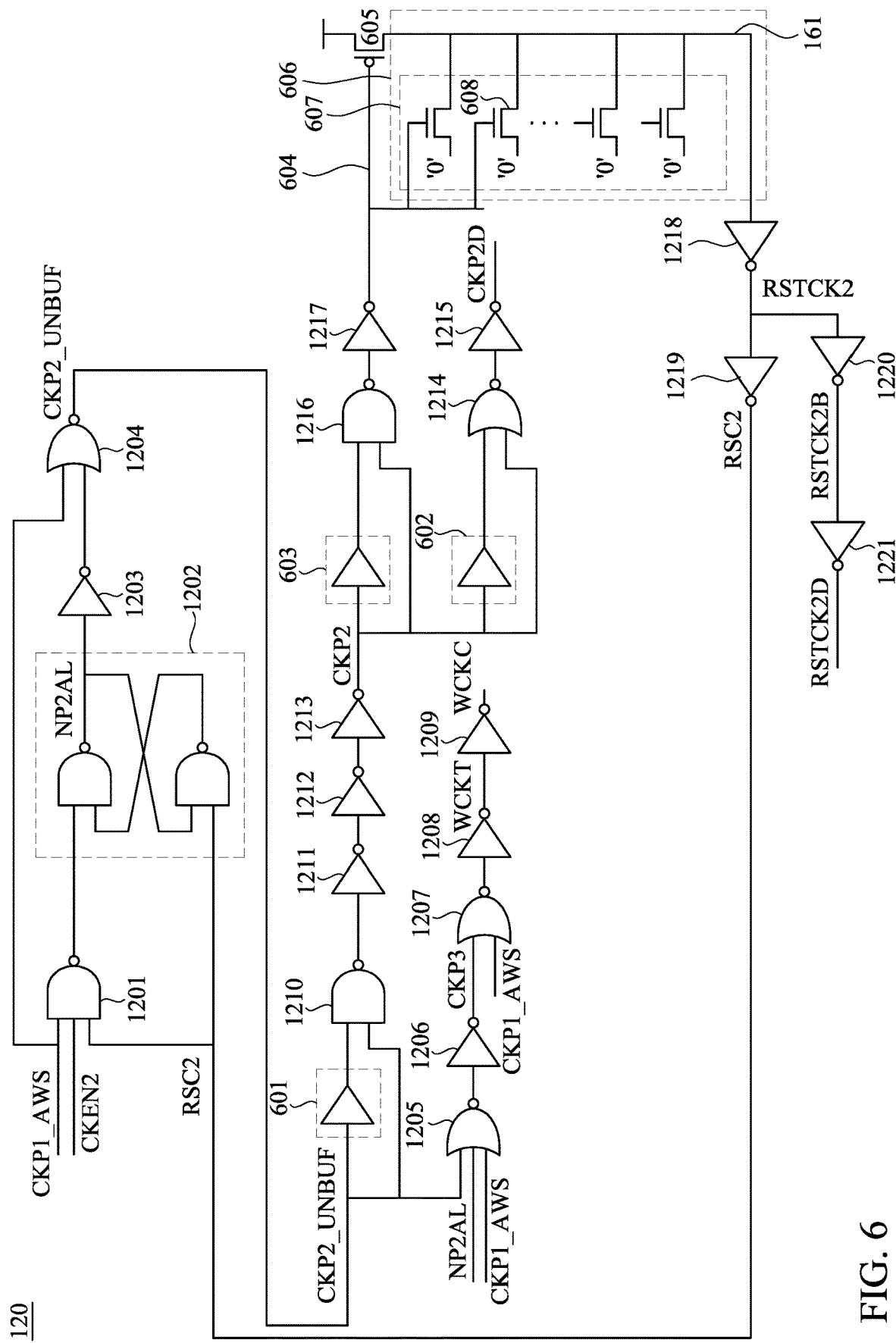
FIG. 6 is a schematic diagram of a clock generator, in accordance with some embodiments of the present disclosure.

Reference is now made to FIG. 6. FIG. 6 is a schematic diagram of the clock generator 120, in accordance with some embodiments of the present disclosure. In some embodiments, the clock generator 120 is configured to generate signals used in the memory device 10 as shown in FIGS. 1-5.

For illustration, the clock generator 120 includes multiple logic circuits (e.g., NOR gates, NAND gates, inverter, and/or buffers) 1201-1221, delay chains 601-603, and a delay circuit 606 to generate signals for operating the memory device 10 having the write port input latch circuit 200 shown in FIGS. 2-3. In some embodiments, the clock generator 120 is implemented as a self-timing clock generator with a rest signal RSC2 associated with the write operation. The design of the rest signal RSC2 guarantees pulses in the latch clock signal WCKT and the latch clock signal RSTCK2D partially overlap with each other and accordingly that the falling edge EF4 of the latch clock signal RSTCK2D is after the falling edge EF2 of the gating clock signal CKP2D to ensure an internal hold time of the data of the output signal D_Lat_2 from the gating circuit 220 being sufficient. Alternatively stated, the latch circuit 312 latches the data of the output signal D_Lat_2 until the gating circuit 220 fully outputs the data to the memory array 110 for the write operation.

In operation, according to some embodiments, the NAND gate 1201 receives signals CKP1_AWS, CKEN2 and the reset signal RSC2 and outputs a corresponding output to the SR latch 1202. In some embodiments, the pulse in the signal CKP1_AWS corresponds to the read pulse of the internal clock signal CKP. The SR latch 1202 generates, based on the output of the NAND gate 1201 and the reset signal RSC2, a signal NP2AL to the inverter 1203. The NOR gate 1204 receives the output from the inverter 1203 and the signal CKP1_AWS to generate a signal CKP2_UNBUF to the delay chain 601 and the NOR gate 1205.

For generating the latch clock signals WCKT and WCKC, the NOR gate 1205 generates, based on the signals NP2AL, CKP2_UNBUF, and CKP1_AWS, a corresponding output to the inverter 1206. The inverter 1206 generates a signal CKP3 to the NOR gate 1207. The NOR gate 1207 generates a corresponding output to the inverter 1208 based on the signal CKP1_AWS and the signal CKP3. The inverter 1208 generates the latch clock signal WCKT by inverting the output of the NOR gate 1207. The inverter 1209 generates the latch clock signal WCKC by inverting latch clock signal WCKT.

In some embodiments, the delay chain 601 includes a certain number of buffers to delay the signal CKP2_UNBUF to further generate a signal CKP2 through the NAND gate 1210 and the inverters 1211-1213. In some embodiments, the number of the buffers in the delay chain 601 is associated with and determined by the time difference between the read and write operations of the memory array 110. In some embodiments, the signal CKP2 corresponds to the write pulse of the internal clock signal CKP.

For generating the gating clock signal CKP2D, the signal CKP2 is transmitted into the NOR gate 1214 and the delay chain 602 generates a delayed signal based on the CKP2 to the NOR gate 1214. The NOR gate 1214 generates a corresponding output to the inverter 1215 based on the delayed signal and the signal CKP2 for generating the gating clock signal CKP2D. In some embodiments, the delay chain 602 includes a certain number of buffers to delay the signal CKP2, and the number of the buffers in the delay chain 602 is associated with the write operation of the memory array 110.

The delay chain 603 including a certain number of buffers delays the signal CKP2 and generates a corresponding delay signal to the NAND gate 1216. The NAND gate 1216 receives the delay signal and the signal CKP2 to generate an output to the inverter 1217. An output of the inverter 1217 is coupled to the delay circuit and a gate of a P-type transistor 605 in the clock generator 120 through a tracking word line 604. The transistor 605 has a source coupled to a voltage terminal providing, for example, the voltage VDDHD, and a drain coupled to the delay circuit 606 and the inverter 1218 through a dummy bit line 161 in the delay circuit 606.

The delay circuit 606 further includes a tracking cell 607 having multiple dummy pull down devices 608. As shown in FIG. 6, gates of the dummy pull down devices 608 are coupled to the tracking word line 604, sources/drains of the dummy pull down devices 608 are coupled to the dummy bit line 161, and drains/sources of the dummy pull down devices 608 are coupled to a ground or a voltage corresponding to the low logic state.

In some embodiments, the delay circuit 606 is configured to delay of portion, for example, the signal CKP2 corresponding to the write pulse of the internal clock signal CKP, for generating the latch clock signal RSTCK2D. The dummy bit line 161 has a length close to a length of a bit line, for example, the bit line BL or BLB, coupled to the memory array 110. The dummy pull down devices 608 are configured to track a performance of a bit line pre-charging the memory array 110. For example, the dummy pull down devices 608 track the performance (for example, by matching the size) of the devices (not shown) in a bit-line pre-charge circuit of the input/output circuit 150. A capacitor Cb1 of the dummy pull down devices 608 is designed to have the capacitance tracking the capacitance of normal bit lines BL and BLB (FIG. 1). This may be achieved by forming the dummy bit line 161 (FIG. 1), which may have the same length as normal bit lines BL and BLB (FIG. 1). The capacitance of dummy bit line 161 is used as the capacitance of Cb1. Similarly, a resistor Rb1 of the dummy pull down devices 608 is designed to have the resistance tracking the resistance of normal bit lines BL and BLB (FIG. 1). This may also be achieved by forming the dummy bit line 161, which may have the same length and the same width as normal bit lines BL and BLB, wherein the dummy bit line 161 is used as resistor Rb1. In some embodiments, when the bit-line pre-charging takes long time due to, for example, long bit lines BL and BLB, the delay circuit 606 also has an increased delay, and vice versa. The resulting clock generator 120 is thus has an optimized bit-line pre-charging time, and the frequencies of write operation may be increased.

Continued to refer to FIG. 6, the inverter 1218 generates a signal RSTCK2 according to an output of the delay circuit 606 to the inverters 1219-1220. The inverter 1219 generates the reset signal RSC2 based on the RSTCK2 to the NAND gate 1201 and the SR latch 1202. The inverter 1220 generates the latch clock signal RSTCK2B to the inverter 1221 for generating the latch clock signal RSTCK2D.

Figure 7:
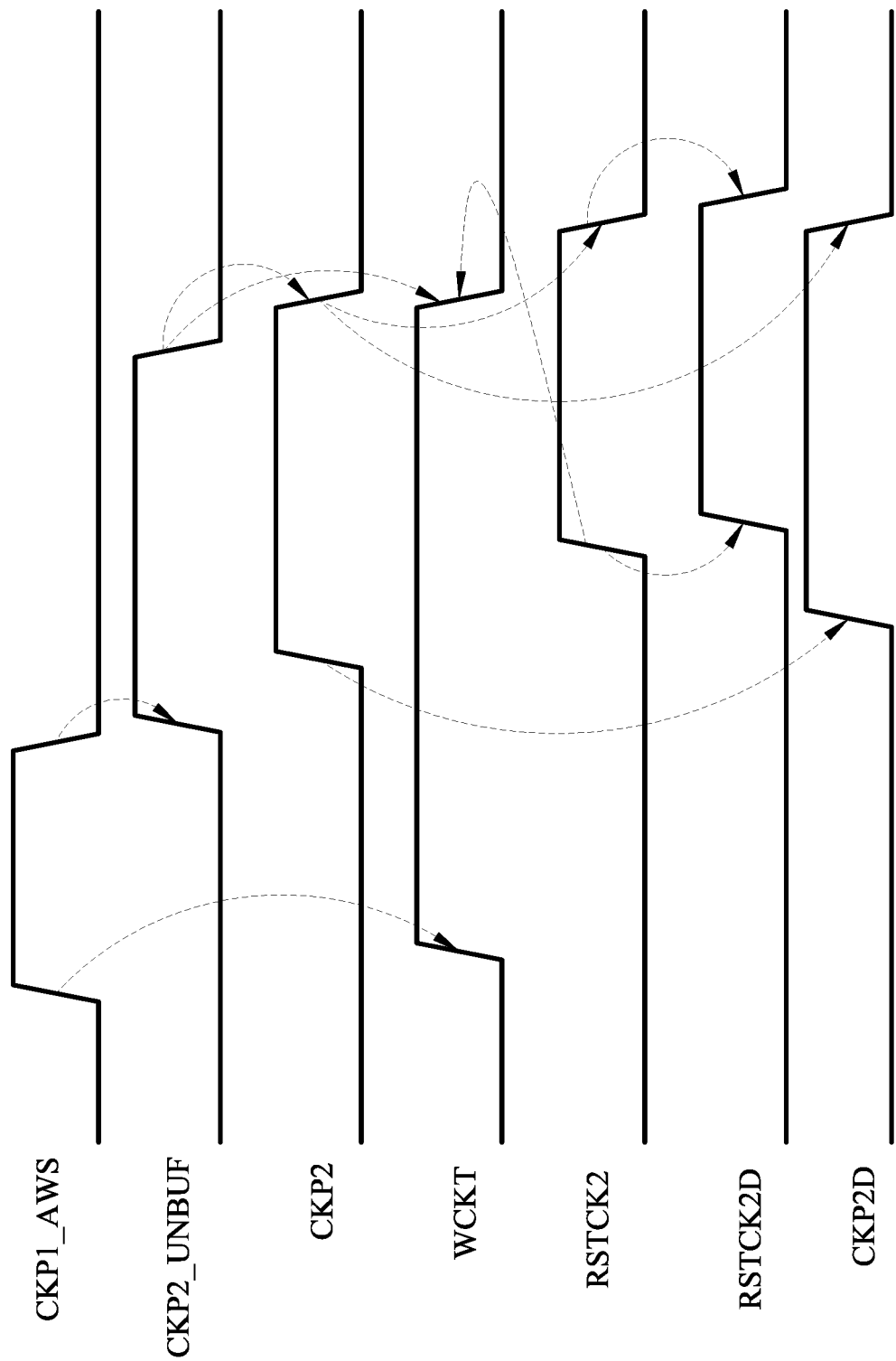
FIG. 7 illustrates waveforms of signals in the clock generator in FIG. 6, in accordance with some embodiments of the present disclosure.

Reference is now made to FIG. 7. FIG. 7 illustrates waveforms of signals in the clock generator 120 in FIG. 6, in accordance with some embodiments of the present disclosure.

In some embodiments, a rising edge of the signal CKP1_AWS triggers the rising edge of the latch clock signal WCKT, and a falling edge of the signal CKP1_AWS triggers the rising edge of the signal CKP2_UNBUF. A falling edge of the signal CKP2_UNBUF triggers a falling edge of the signal CKP2 and a falling edge of the latch clock signal WCKT. In some embodiments, a rising edge of the signal RSTCK2 triggers the falling edge of the latch clock signal WCKT. A rising edge of the signal CKP2 triggers a rising edge of the gating clock signal CKP2D. A falling edge of the signal CKP2 triggers a falling edge of the signal RSTCK2 and a falling edge of the gating clock signal CKP2D. A rising edge of the signal RSTCK2 triggers a rising edge of the latch clock signal RSTCK2D, and the falling edge of the signal RSTCK2 triggers the falling edge of the latch clock signal RSTCK2D.

Figure 8:
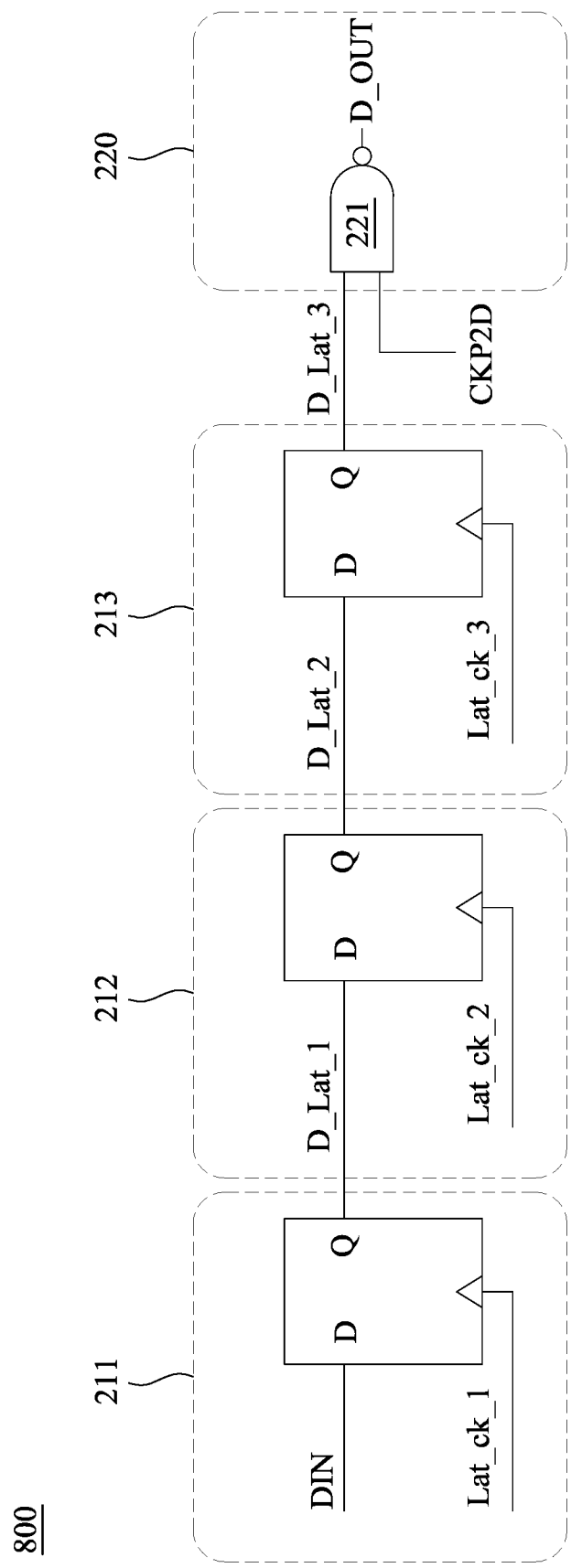
FIG. 8 is a schematic diagram of a write port input latch circuit, in accordance with some embodiments of the present disclosure.

Reference is now made to FIG. 8. FIG. 8 is a schematic diagram of a write port input latch circuit 800, in accordance with some embodiments of the present disclosure. In some embodiments, the write port input latch circuit 800 is configured with respect to, for example, the write port input latch circuit 200 of FIG. 2. With respect to the embodiments of FIGS. 1-7, like elements in FIG. 8 are designated with the same reference numbers for ease of understanding. The specific operations of similar elements, which are already discussed in detail in above paragraphs, are omitted herein for the sake of brevity.

Compared with the embodiments of FIG. 2, the write port input latch circuit 800 further includes a latch circuit 213 coupled between the latch circuit 212 and the gating circuit 220. In some embodiments, the latch circuit 213 is configured with respect to, for example, the latch circuit 212, and configured to generate, based on the output signal D_Lat_2, an output signal D_Lat_3 in response to the latch clock signal Lat_ck_3, and the gating circuit 220 generates the gating output signal D_OUT based on the output signal D_Lat_3.

Reference is now made to FIG. 9. FIG. 9 illustrates waveforms of signals in the memory device 10 in FIG. 1 having the write port input latch circuit 800 of FIG. 8, in accordance with some embodiments of the present disclosure.

For illustration, pulses in the latch clock signals Lat_ck_1 to Lat_ck_3 partially and successively overlap with each other, and the pulse widths of the latch clock signals Lat_ck_1 to Lat_ck_3 are associated with the time delay generated by the tristate inverters and the inverters that are coupled series in the latch circuits 211-213.

Specifically, the falling edge EF1 of the latch clock signal Lat_ck_1, configured with respect to, for example, the latch clock signal WCKT of FIG. 4, is between a rising edge ER5 of the latch clock signal Lat_ck_2 and a falling edge EF5 of the latch clock signal Lat_ck_2. Similarly, a rising edge ER7 of the latch clock signal Lat_ck_3 is before the falling edge EF5 of the latch clock signal Lat_ck_2. A falling edge EF6 of the latch clock signal Lat_ck_3 is after the falling edge EF2 of the gating clock signal CKP2D.

As shown in FIGS. 8-9, the time T2, the latch circuit 211 latches the data of the output signal D_Lat_1 in the latch mode while the latch circuits 212-213 operate in the transparent mode to read the output signals D_Lat_1 and the output signal D_Lat_2 sequentially. The latch circuit 213 further generates the output signal D_Lat_3 having the same logic state as the input signal DIN.

At time T3, the latch circuit 212 switches to the latch mode in response to the rising edge ER5 of the latch clock signal Lat_ck_2.

In some embodiments, after time T3, the latch circuit 211 switches to the transparent mode to read the data of the input signal DIN in response to the falling edge EF1 of the latch clock signal Lat_ck_1, and accordingly the logic state of the output signal D_Lat_1 changes. However, the logic state is unchanged due to the latch circuit 212 operating in the latch mode.

At time T4, the latch circuit 213 switches to the latch mode in response to the rising edge ER7 of the latch clock signal Lat_ck_3.

In some embodiments, after time T4, the latch circuit 212 switches to the transparent mode to read the data of the output signal D_Lat_1 in response to the falling edge EF5 of the latch clock signal Lat_ck_2, and accordingly the logic state of the output signal D_Lat_2 changes. However, the logic state is unchanged due to the latch circuit 213 operating in the latch mode.

At time T5, the latch circuit 213 switches to the transparent mode to read the data of the output signal D_Lat_2 in response to the falling edge EF6 of the latch clock signal Lat_ck_3, and accordingly the logic state of the output signal D_Lat_3 changes.

Figure 10:
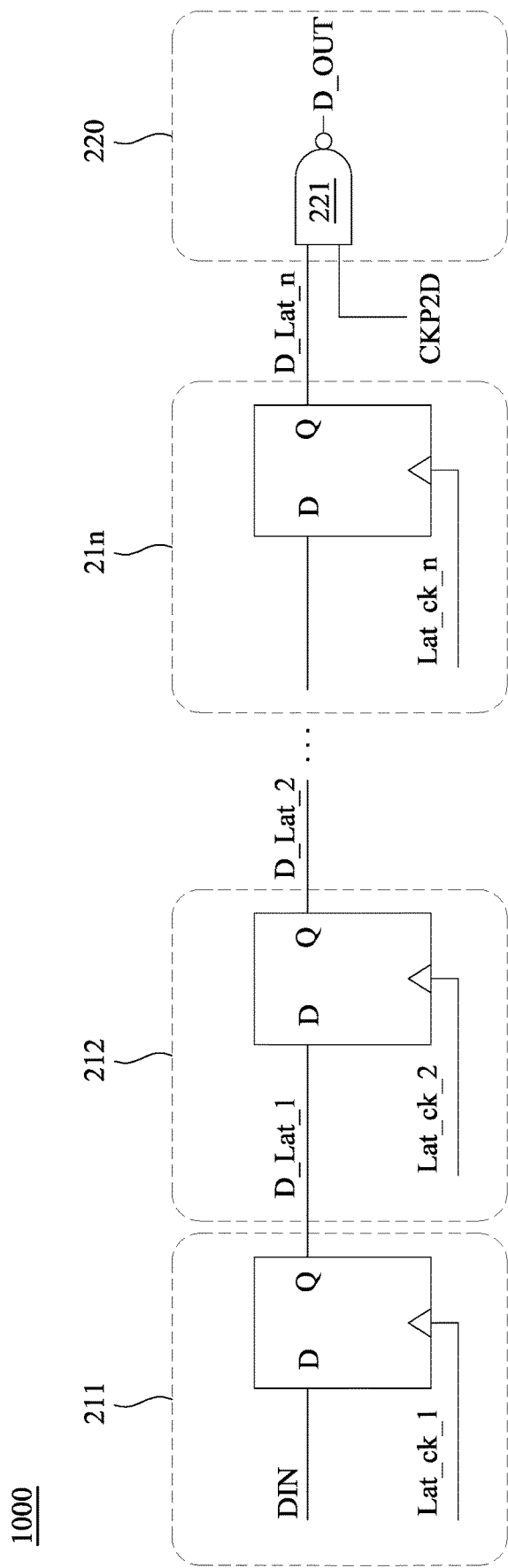
FIG. 10 is a schematic diagram of a write port input latch circuit, in accordance with some embodiments of the present disclosure.

Reference is now made to FIG. 10. FIG. 10 is a schematic diagram of a write port input latch circuit 1000, in accordance with some embodiments of the present disclosure. With respect to the embodiments of FIGS. 1-9, like elements in FIG. 10 are designated with the same reference numbers for ease of understanding.

In some embodiments, the write port input latch circuit 1000 is configured with respect to, for example, the write port input latch circuit 200 of FIG. 2 and the write port input latch circuit 800 of FIG. 8. Compared with the embodiments of FIG. 8, the write port input latch circuit 1000 further includes a number N of the latch circuits 211-21n, N being a positive integer. In some embodiments, N is equal to or greater than 3. For illustration, the gating circuit 220 is coupled to the N-th latch circuit 21n of the latch circuits 211-21n and is configured to generate, in response to the N-th output signal output signal D_Lat_n and the gating clock signal CKP2D, the gating output signal D_OUT to the memory array 110 for the write operation of the memory array 110.

In some embodiments, the latch clock signals Lat_ck_1-Lat_ck_n partially and successively overlap with each other, in which a rising edge of a pulse in the M-th latch clock signal of the latch clock signals Lat_ck_1-Lat_ck_n is between rising and falling edges of the (M−1)-th latch clock signal of the latch clock signals Lat_ck_1-Lat_ck_n. M is a positive integer smaller than N. For example, when N is equal to 3 and M is equal to 2, as shown in FIG. 9, the rising edge ER5 of the latch clock signal Lat_ck_2 is between the rising edge ER2 of the latch clock signal Lat_ck_1 and the falling edge EF1 of the latch clock signal Lat_ck_1.

Moreover, according to some embodiments, a falling edge of the latch clock signal Lat_ck_n is after the falling edge of the gating clock signal CKP2D.

Generally, an operational time of the write operation is the bottle neck of cycle time of the pseudo dual-port SRAM as a faster possible frequency (Fmax) is a major concern in SRAM design for high performance computing (HPC) applications. For example, in some approaches having a latch circuit and a gating circuit that are configured to latch and output the data associated with the write ports (e.g., the write enable pin, the write address pin, and or data pin), the faster possible frequency Fmax is limited by the write port interface setup time. Alternatively stated, a long cycle time for latching data in write operation constrains an increase of the faster possible frequency Fmax. In some architecture of the approaches, a falling edge of a latch clock signal for the latch circuit of the write port is designed to be triggered after the write operation is completed. In other words, according to some approaches, the falling edge of the latch clock signal is after the falling edge of the clock signal for the gating circuit which outputs the data to the memory array. Therefore, sufficient pulse width is necessary for the latch clock signal and is not reduced, which increases the cycle time overall.

As described above, with the configurations of the present disclosure, at least two latch circuits are configured in the write port input latch circuit and corresponding latch clock signals partially and successively overlap with each other, which makes latch circuits latch input data sequentially. Accordingly, the last latch circuit and the gating circuit cooperate to output data for the write operation in response to the corresponding latch clock signals during an internal hold time which is irrelevant to a data hold time of the first latch circuit in the write port input latch circuit. Alternatively stated, the data hold time of the first latch circuit can be shrunk as for the last latch circuit latches the data. Correspondingly, an increased faster possible frequency Fmax is achieved.

In some embodiments, a memory device is disclosed. The memory device includes a memory array and first to second latch circuits. A read operation thereof is triggered by a first edge of an internal clock signal and a write operation thereof is triggered by a second edge of the internal clock signal. The read and write operations of the memory array are performed within a same clock cycle of the internal clock signal. The first latch circuit generates a first output signal in response to an input signal and a first latch clock signal. A first edge of the first latch clock signal is generated based on the first edge of the internal clock signal. The second latch circuit is coupled to an output terminal of the first latch circuit and generates a second output signal in response to the first output signal and a second latch clock signal. A first edge of the second latch clock signal is between the first edge of the first latch clock signal and a second edge of the first latch clock signal. The memory device further includes a gating circuit configured to generate, in response to the second output signal and a gating clock generated based on the second edge of the internal clock signal, a third output signal to the memory array for the write operation.

Also disclosed is a memory device that includes a plurality of latch circuits and a gating circuit. Each of the plurality of latch circuits is configured to latch, in response to a corresponding one in a plurality of latch clock signals, data associated with an input signal. Pulses in the plurality of latch clock signals partially and successively overlap in a clock cycle of an internal clock signal. The gating circuit is coupled to an N-th latch circuit of the plurality of latch circuits and is configured to generate, in response to an N-th output signal of the N-th latch circuit and a gating clock signal, a gating output signal to a memory array for a write operation of the memory array. N is an amount of the plurality of latch circuits. A read operation of the memory array is triggered by a first pulse of the internal clock signal and the write operation of the memory array is triggered by a second pulse of the internal clock signal. The read and write operations of the memory array are performed within a same clock cycle of the internal clock signal.

Also disclosed is a method includes operations: triggering a read operation of a memory array by a first rising edge of an internal clock signal; generating, based on the first rising edge of the internal clock signal, a first rising edge of a first latch clock signal to latch a data of a first output signal; triggering a write operation of the memory array by a second rising edge of the internal clock signal; and generating, based on the second rising edge of the internal clock signal, a rising edge of a second latch clock signal to latch a data of a second output signal for the write operation of the memory array, wherein the rising edge of the second latch clock signal is before a falling edge of the first latch clock signal. The read and write operations of the memory array are performed within a same clock cycle of the internal clock signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   a memory array, wherein a read operation thereof is triggered by a first edge of an internal clock signal and a write operation thereof is triggered by a second edge of the internal clock signal, wherein the read and write operations of the memory array are performed within a same clock cycle of the internal clock signal;
   a first latch circuit configured to generate a first output signal in response to an input signal and a first latch clock signal, wherein a first edge of the first latch clock signal is generated based on the first edge of the internal clock signal;
   a second latch circuit coupled to an output terminal of the first latch circuit and configured to generate a second output signal in response to the first output signal and a second latch clock signal, wherein a first edge of the second latch clock signal is between the first edge of the first latch clock signal and a second edge of the first latch clock signal; and
   a gating circuit configured to generate, in response to the second output signal and a gating clock generated based on the second edge of the internal clock signal, a third output signal to the memory array for the write operation.

2. The memory device of claim 1, wherein the first and second edges of the internal clock signal are rising edges.

3. The memory device of claim 1, wherein a falling edge of the gating clock is after a falling edge, after the second edge, of the internal clock signal.

4. The memory device of claim 1, wherein the second latch circuit is configured to latch a data of the second output signal when the first latch circuit is configured to be in a transparent mode to read a data of the input signal.

5. The memory device of claim 1, wherein a time difference between the first edge of the first latch clock signal and the first edge of the second latch clock signal is greater than a delay time between input and output terminals of the second latch circuit.

6. The memory device of claim 1, further comprising:
   a clock generator comprising a delay circuit configured to delay a portion of the internal clock signal for generating the second latch clock signal.

7. The memory device of claim 1, wherein the first latch circuit comprises a first tristate inverter and a first inverter coupled to the first tristate inverter, the first tristate inverter being configured to generate, based on the input signal, a first inner output signal to the first inverter, and the first inverter being configured to generate, based on the first inner output signal, the first output signal;
   wherein the second latch circuit comprises a second tristate inverter and a second inverter coupled to the second tristate inverter, the second tristate inverter being configured to generate, based on the first output signal, a second inner output signal to the second inverter, and the second inverter being configured to generate, based on the second inner output signal, the second output signal.

8. The memory device of claim 3, wherein a second edge of the second latch clock signal is after the falling edge of the gating clock.

9. The memory device of claim 6, wherein the delay circuit comprises:
   a dummy bit line having a length close to a length of a bit line coupled to the memory array; and
   a plurality of dummy pull down devices configured to track a performance of a bit line pre-charing of the memory array.

10. A memory device, comprising:
    a plurality of latch circuits each configured to latch, in response to a corresponding one in a plurality of latch clock signals, data associated with an input signal, wherein pulses in the plurality of latch clock signals partially and successively overlap in a clock cycle of an internal clock signal; and
    a gating circuit coupled to an N-th latch circuit of the plurality of latch circuits and configured to generate, in response to an N-th output signal of the N-th latch circuit and a gating clock signal, a gating output signal to a memory array for a write operation of the memory array, N being an amount of the plurality of latch circuits,
    wherein a read operation of the memory array is triggered by a first pulse of the internal clock signal and the write operation of the memory array is triggered by a second pulse of the internal clock signal, wherein the read and write operations of the memory array are performed within a same clock cycle of the internal clock signal.

11. The memory device of claim 10, wherein the plurality of latch circuits are coupled in series between an input terminal, configured to transmit the input signal, of the memory device and the gating circuit.

12. The memory device of claim 10, wherein a falling edge of a pulse in a first latch clock signal of the plurality of latch clock signals is before a falling edge of the gating clock signal.

13. The memory device of claim 10, wherein a falling edge of a pulse in a first latch clock signal of the plurality of latch clock signals is after a rising edge of a second latch clock signal of the plurality of latch clock signals.

14. The memory device of claim 10, wherein each of the plurality of latch circuits comprises a tristate inverter and an inverter that are coupled in series to receive an output signal from a previous latch circuit in the plurality of latch circuits and to output the output signal to a next latch circuit in the plurality of latch circuits,
    wherein pulse widths of the pulses in the plurality of latch clock signals is associated with a time delay generated by the tristate inverters and the inverters.

15. The memory device of claim 12, wherein a falling edge of a pulse in an N-th latch clock signal of the plurality of latch clock signals is after the falling edge of the gating clock signal.

16. The memory device of claim 15, wherein a rising edge of a pulse in a M-th latch clock signal of the plurality of latch clock signals is between rising and falling edges of a (M−1)-th latch clock signal of the plurality of latch clock signals, M being a positive integer smaller than N.

17. A method, comprising:
    triggering a read operation of a memory array by a first rising edge of an internal clock signal;

generating, based on the first rising edge of the internal clock signal, a first rising edge of a first latch clock signal to latch a data of a first output signal;

triggering a write operation of the memory array by a second rising edge of the internal clock signal; and generating, based on the second rising edge of the internal clock signal, a rising edge of a second latch clock signal to latch a data of a second output signal for the write operation of the memory array, wherein the rising edge of the second latch clock signal is before a falling edge of the first latch clock signal, wherein the read and write operations of the memory array are performed within a same clock cycle of the internal clock signal.

18. The method of claim 17, further comprising:

generating, based on a first falling edge of the internal clock signal, a rising edge of a gating clock signal to generate a gating output signal based on the second output signal to the memory array.

19. The method of claim 18, further comprising:

generating, based on a second falling edge of the internal clock signal, a falling edge of the gating clock signal, wherein the falling edge of the gating clock signal is after the falling edge of the first latch clock signal.

20. The method of claim 17, further comprising:

generating, based on a falling edge of the internal clock signal, a falling edge of the second latch clock signal to change a logic state of the second output signal, wherein the falling edge of the second latch clock signal is before a second rising edge of the first latch clock signal.

* * * * *